United States Patent
Galburt et al.

(10) Patent No.: US 7,437,911 B2
(45) Date of Patent: Oct. 21, 2008

(54) METHOD AND SYSTEM FOR OPERATING AN AIR GAUGE AT PROGRAMMABLE OR CONSTANT STANDOFF

(75) Inventors: Daniel N. Galburt, Wilton, CT (US); Boguslaw F. Gajdeczko, Princeton, NJ (US)

(73) Assignee: ASML Holding N.V., Veldhoven (NL)

(*) Notice: Subject to any disclaimer, the term of this patent is extended or adjusted under 35 U.S.C. 154(b) by 0 days.

(21) Appl. No.: 11/011,435

(22) Filed: Dec. 15, 2004

(65) Prior Publication Data

US 2006/0123888 A1    Jun. 15, 2006

(51) Int. Cl.
  *G01B 13/08*  (2006.01)
  *G01M 3/02*  (2006.01)
(52) U.S. Cl. .................................. 73/37.5; 73/37
(58) Field of Classification Search ............. 73/37, 73/37.5, 37.6, 37.8
  See application file for complete search history.

(56) References Cited

U.S. PATENT DOCUMENTS

| 2,707,389 | A | * | 5/1955 | Fortier | 73/37.5 |
|---|---|---|---|---|---|
| 4,472,824 | A | * | 9/1984 | Buckley | 378/34 |
| 4,607,525 | A | * | 8/1986 | Turner et al. | 73/37.5 |
| 4,658,633 | A | * | 4/1987 | Freer | 73/37.5 |
| 4,977,777 | A | * | 12/1990 | Bieg | 73/37.5 |
| 5,317,898 | A | * | 6/1994 | Nemeth | 73/37.7 |
| 5,616,853 | A | * | 4/1997 | Oshumi | 73/37.5 |
| 5,789,661 | A | * | 8/1998 | Fauque et al. | 73/37.5 |
| 6,901,797 | B2 | * | 6/2005 | Hyatt et al. | 73/37.5 |
| 7,021,120 | B2 | * | 4/2006 | Carter et al. | 73/37.5 |
| 7,134,321 | B2 | * | 11/2006 | Galburt et al. | 73/37.5 |

* cited by examiner

Primary Examiner—Michael Cygan
(74) Attorney, Agent, or Firm—Sterne, Kessler, Goldstein & Fox P.L.L.C (57) ABSTRACT

Provided are a method and system for measuring a distance to an object. The system includes an air gauge configured to sense a distance to a surface of the object and a sensor configured to measure at least one from the group including (i) a relative position of the air gauge and (ii) a relative position of the surface of the object. Outputs of the air gauge and the sensor are combined to produce a combined air gauge reading.

10 Claims, 5 Drawing Sheets

METHOD AND SYSTEM FOR OPERATING AN AIR GAUGE AT PROGRAMMABLE OR CONSTANT STANDOFF

BACKGROUND OF THE INVENTION

1. Field of the Invention

The present invention relates to pressure sensors, more particularly, to air gauge devices used in lithography systems.

2. Background Art

Conventional style air gauges are used to measure the location of a wafer surface in a number of lithography tools. These conventional air gauges include a bridge having a measurement nozzle located near the wafer's surface. The conventional air gauges typically also include a separate reference nozzle located near, or in the same environment as, measurement components. As a gap between the wafer and the measurement nozzle changes, the flow rate through the measurement nozzle is altered, and a change in differential pressure or flow in the bridge is detected.

In general, although the measurement nozzle may be retractable, its position is fixed during the measurement process. Likewise, the gap between a reference nozzle and its target may be adjustable, but remains fixed during the measurement process. The gap measurements made by these conventional air gauges are most accurate when the wafer surface is at the nominal gap where the flow through the bridge is nearly balanced, and becomes less accurate as the measurement gap moves away from the nominal value. Off null, the air gauge becomes sensitive to changes and ambient pressure, and the relationship between gap and sensed differential flow or pressure is non-linear.

The air gauge can be used at typical standoffs of less than approximately 0.150 millimeters (mm). At the physical scales of interest to wafer surface sensing, a substantial increase in an air gauge standoff value (H) is not possible, as the measurement sensitivity drops quite drastically, approximately to $H^{-3.3}$. At such small standoffs, there is a possibility of a collision between the air gauge nozzle and, for example, a wafer surface.

Also, to the extent that the air gauge is required to accurately measure a range of wafer positions, its accuracy is limited.

What is needed, therefore, is a method and system for facilitating measurements where the air gauge will always be operated at a favorable standoff, maximizing its performance and useful measurement range. More specifically, what is needed is a gauging device that will minimize the risk of a collision between the air gauge nozzle and the surface of the wafer.

BRIEF SUMMARY OF THE INVENTION

Consistent with the principles of the present invention as embodied and broadly described herein, the present invention includes a gauging apparatus for measuring a distance to an object. The apparatus includes an air gauge configured to sense a distance to a surface of the object and a sensor configured to measure at least one from the group including (i) a relative position of the air gauge and (ii) a relative position of the surface of the object. Outputs of the air gauge and the sensor are combined to produce a combined air gauge reading.

In the present invention, the air gauge position is controlled with an actuator operated in a classical negative feedback loop. A difference between the air gauge reading and a programmable set point value can be used to keep the measurement gap constant. Thus, while scanning a wafer, the air gauge maintains a known constant preprogrammed distance from the wafer surface and consequently, avoids colliding with the wafer.

At the same time, any variable distance between the air gauge and a fixed spatial reference can be constantly measured by a separate distance sensor with desirable characteristics for both range and accuracy. For example, an optical interferometer or a precision linear encoder can be used as this separate distance sensor.

An alternative to adjusting, (e.g., servoing) the measurement gap is to servo the reference gap, and use a separate sensor to measure the position of the reference nozzle. This approach will improve the performance of the air gauge, and will prevent a collision between the air gauge measurement nozzle and the wafer surface. Recent developments in low-flow air gauges indicate that if the volume of the air gauge bridge is reduced and a differential sensor with a higher frequency response is used, the overall bandwidth of the air gauge can be improved sufficiently to support active gap servoing for lithographic tool applications.

Further features and advantages of the present invention as well as the structure and operation of various embodiments of the present invention, are described in detail below with reference to the accompanying drawings.

BRIEF DESCRIPTION OF THE DRAWINGS/FIGURES

The accompanying drawings, which are incorporated in and constitute part of the specification, illustrate embodiments of the invention and, together with the general description given above and the detailed description of the embodiment given below, serve to explain the principles of the present invention. In the drawings.

DETAILED DESCRIPTION OF THE INVENTION

The following detailed description of the present invention refers to the accompanying drawings that illustrate exemplary embodiments consistent with this invention. Other embodiments are possible, and modifications may be made to the embodiments within the spirit and scope of the invention.

Therefore, the following detailed description is not meant to limit the invention. Rather, the scope of the invention is defined by the appended claims.

It would be apparent to one skilled in the art that the present invention, as described below, may be implemented in many different embodiments of hardware, software, firmware, and/or the entities illustrated in the drawings.

Any actual software code with the specialized controlled hardware to implement the present invention is not limiting of the present invention. Thus, the operation and behavior of the present invention will be described with the understanding that modifications and variations of the embodiments are possible, given the level of detail presented herein.

Figure 1:
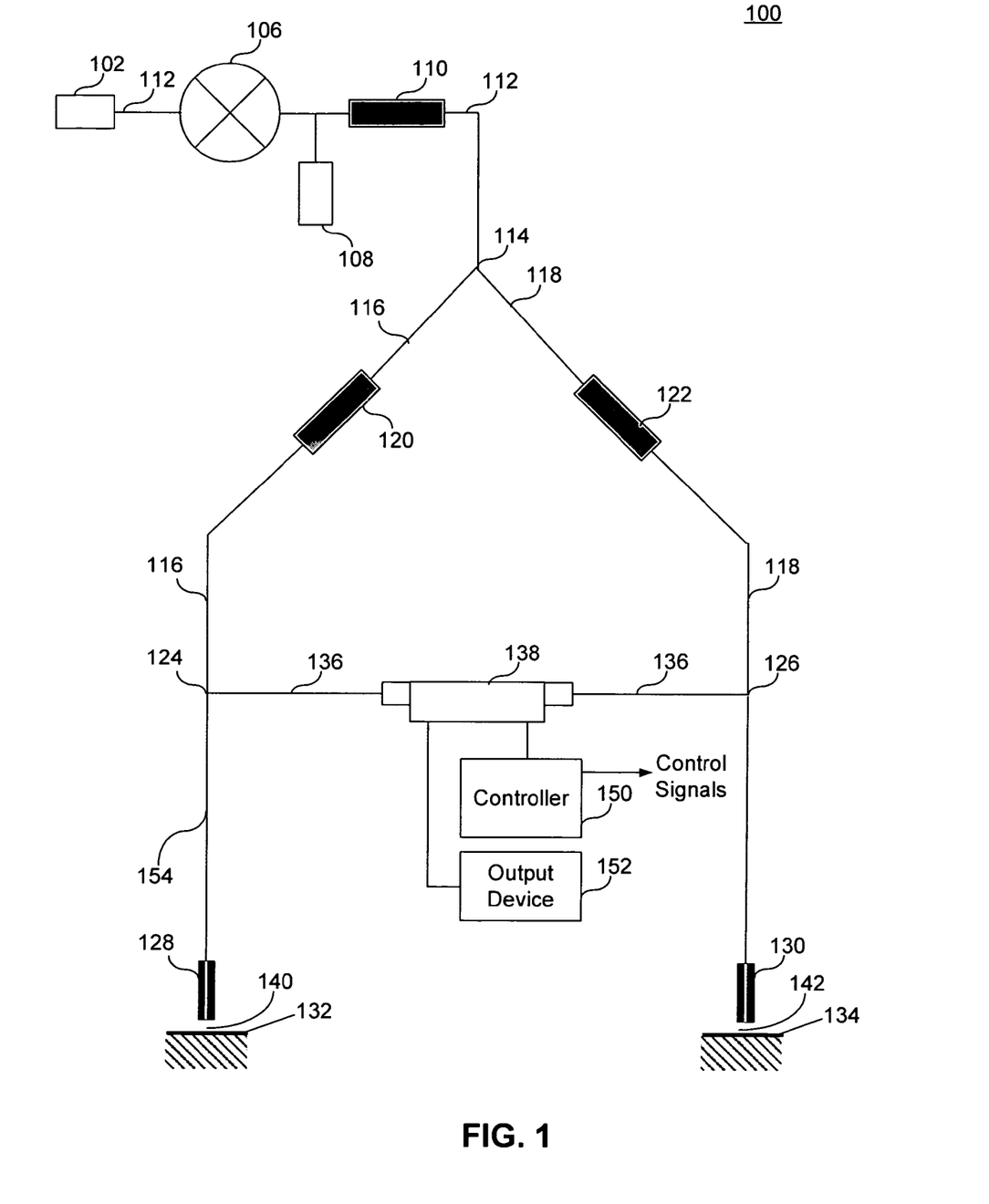
FIG. 1 is a block diagram illustration of a gas proximity sensing apparatus.

FIG. 1 illustrates a conventional gas gauge proximity sensor 100, according to an embodiment of the present invention. The gas gauge proximity sensor 100 can include a mass flow controller 106, a central channel 112, a measurement channel 116, a reference channel 118, a measurement channel restrictor 120, a reference channel restrictor 122, a measurement probe 128, a reference probe 130, a bridge channel 136, and a mass flow sensor 138. A gas supply 102 can inject gas at a desired pressure into gas gauge proximity sensor 100.

The central channel 112 connects the gas supply 102 to the mass flow controller 106 and then terminates at a junction 114 (e.g., a gas dividing or directing portion). The mass flow'controller 106 can maintain a constant flow rate within the gas gauge proximity sensor 100. Gas is forced out from the mass flow controller 106 through a porous snubber 110, with an accumulator 108 affixed to the channel 112. The snubber 110 can reduce gas turbulence introduced by the gas supply 102, and its use is optional.

Upon exiting the snubber 110, gas travels through the central channel 112 to the junction 114. The central channel 112 terminates at the junction 114 and divides into the measurement channel 116 and the reference channel 118. In one embodiment, the mass flow controller 106 can inject gas at a sufficiently low rate to provide laminar and incompressible fluid flow throughout the system to minimize the production of undesired pneumatic noise.

A bridge channel 136 is coupled between the measurement channel 116 and the reference channel 118. The bridge channel 136 connects to the measurement channel 116 at the junction 124. The bridge channel 136 connects to the reference channel 118 at the junction 126. In one embodiment, the distance between the junction 114 and the junction 124 and the distance between the junction 114 and the junction 126 are equal. It is to be appreciated that other embodiments are envisioned with different arrangements.

All channels within the gas gauge proximity sensor 100 can permit gas to flow through them. The channels 112, 116, 118, and 136 can be made up of conduits (e.g., tubes, pipes, etc.) or any other type of structure that can contain and guide gas flow through the sensor 100, as would be apparent to one of ordinary skill in the art. In most embodiments, the channels 112, 116, 118, and 136 should not have sharp bends, irregularities, or unnecessary obstructions that can introduce pneumatic noise. This noise can result from the production of local turbulence or flow instability, as an example. In various embodiments, the overall lengths of the measurement channel 116 and the reference channel 118 can be equal or unequal.

The reference channel 118 terminates adjacent a reference probe 130.

Likewise, the measurement channel 116 terminates at an adjacent measurement probe 128. The reference probe 130 is positioned above a reference surface 134. The measurement probe 128 is positioned above a measurement surface 132. In the context of photolithography, the measurement surface 132 can be substrate (e.g., a wafer, a flat panel, print head or the like) or stage supporting a substrate. The reference surface 134 can be a flat metal plate, but is not limited to this example.

Nozzles are provided in the measurement probe 128 and the reference probe 130. An example nozzle is described further below with respect to FIGS. 2-4 below. Gas injected by the gas supply 102 is emitted from nozzles in the probes 128 and 130, and impinges upon the measurement surface 132 and the reference surface 134.

As described above, the distance between a nozzle and a corresponding measurement or reference surface can be referred to as a standoff.

In one embodiment, the reference probe 130 is positioned above a fixed reference surface 134 with a known reference standoff 142. The measurement probe 128 is positioned above the measurement surface 132 with an unknown measurement standoff 140. The known reference standoff 142 is set to a desired constant value, which can be at an optimum standoff. With such an arrangement, the backpressure upstream of the measurement probe 128 is a function of the unknown measurement standoff 140; and the backpressure upstream of the reference probe 130 is a function of the known reference standoff 142.

If the standoffs 140 and 142 are equal, the configuration is symmetrical and the bridge is balanced. Consequently, there is no gas flow through the bridging channel 136. On the other hand, when the measurement standoff 140 and the reference standoff 142 are different, the resulting pressure difference between the measurement channel 116 and the reference channel 118 induces a flow of gas through the mass flow sensor 138.

The mass flow sensor 138 is located along the bridge channel 136, which can be at a central point. The mass flow sensor 138 senses gas flow induced by pressure differences between the measurement channel 116 and the reference channel 118. These pressure differences occur as a result of changes in the vertical positioning of measurement surface 132.

In an example where there is a symmetric bridge, the measurement standoff 140 and the reference standoff 142 are equal. The mass flow sensor 138 will detect no mass flow because there will be no pressure difference between the measurement and the reference channels 116 and 118. On the other hand, any differences between the measurement standoff 140 and the reference standoff 142 values can lead to different pressures in the measurement channel 116 and the reference channel 118. Proper offsets can be introduced for an asymmetric arrangement.

The mass flow sensor 138 senses gas flow induced by a pressure difference or imbalance. A pressure difference causes a gas flow, the rate of which is a unique function of the measurement standoff 140. In other words, assuming a constant flow rate into the gas gauge 100, the difference between gas pressures in the measurement channel 116 and the reference channel 118 is a function of the difference between the magnitudes of the standoffs 140 and 142. If the reference standoff 142 is set to a known standoff, the difference between gas pressures in the measurement channel 116 and the reference channel 118 is a function of the size of the measurement standoff 140 (that is, the unknown standoff along a vertical (Z) axis between the measurement surface 132 and the measurement probe 128).

The mass flow sensor 138 detects gas flow in either direction through the bridge channel 136. Because of the bridge configuration, gas flow occurs through the bridge channel 136 only when pressure differences between the channels 116 and 118 occur. When a pressure imbalance exists, the mass flow sensor 138 detects a resulting gas flow, and can initiate an appropriate control function, which can be done using an optional controller 150 that is coupled to appropriate parts of the system 100. The mass flow sensor 138 can provide an indication of a sensed flow through a visual display and/or audio indication, for example, which can be done through use of an optional output device 152.

Alternatively, in place of a mass flow sensor, a differential pressure sensor (not shown) can be used. As well understood by those of skill in the art, a differential pressure sensor is designed to detect a change in pressure as a difference between two applied pressures. The differential pressure sensor measures the difference in pressure between the two channels, which is a function of the difference between the measurement and reference standoffs.

The control function in the optional controller 150 can be to calculate the exact gap differences. In another embodiment, the control function may be to increase or decrease the size of the measurement standoff 140. This is accomplished by moving the measurement surface 132 relative to the measurement probe 128 until the pressure difference is sufficiently close to zero. This occurs when there is no longer a difference between the standoffs from the measurement surface 132 and the reference surface 134.

It is to be appreciated that the mass flow rate controller 106, the snubber 110, and the restrictors 120 and 122 can be used to reduce gas turbulence and other pneumatic noise, which can be used to allow the present invention to achieve nanometer accuracy. These elements can all be used within an embodiment of the present invention or in any combination depending on the sensitivity desired.

For example, if an application required very precise sensitivity, all elements can be used. Alternatively, if an application required less sensitivity, perhaps only the snubber 110 would be used with the porous restrictors 120 and 122 replaced by orifices. As a result, the present invention provides a flexible approach to cost effectively meet the requirements of a particular application.

Porous restrictors 120 and 122 are also used. The porous restrictors 120 and 122 can be used instead of saphire restrictors when pressure needs to be stepped down in many steps, and not quickly. This can be used to avoid turbulence.

The measurement channel 116 and the reference channel 118 contain restrictors 120 and 122. Each of the restrictors 120 and 122 restricts the flow of gas traveling through their respective measurement channel 116 and the reference channel 118. The measurement channel restrictor 120 is located within the measurement channel 116 between the junction 114 and the junction 124.

Likewise, the reference channel restrictor 122 is located within the reference channel 118 between the junction 114 and the junction 126. In one example, the distance from the junction 114 to the measurement channel restrictor 120 and the distance from the junction 114 to the reference channel restrictor 122 are equal. In other examples, the distances are not equal. There is no inherent requirement that the sensor be symmetrical; however, the sensor is easier to use if it is geometrically symmetrical.

Figure 2:
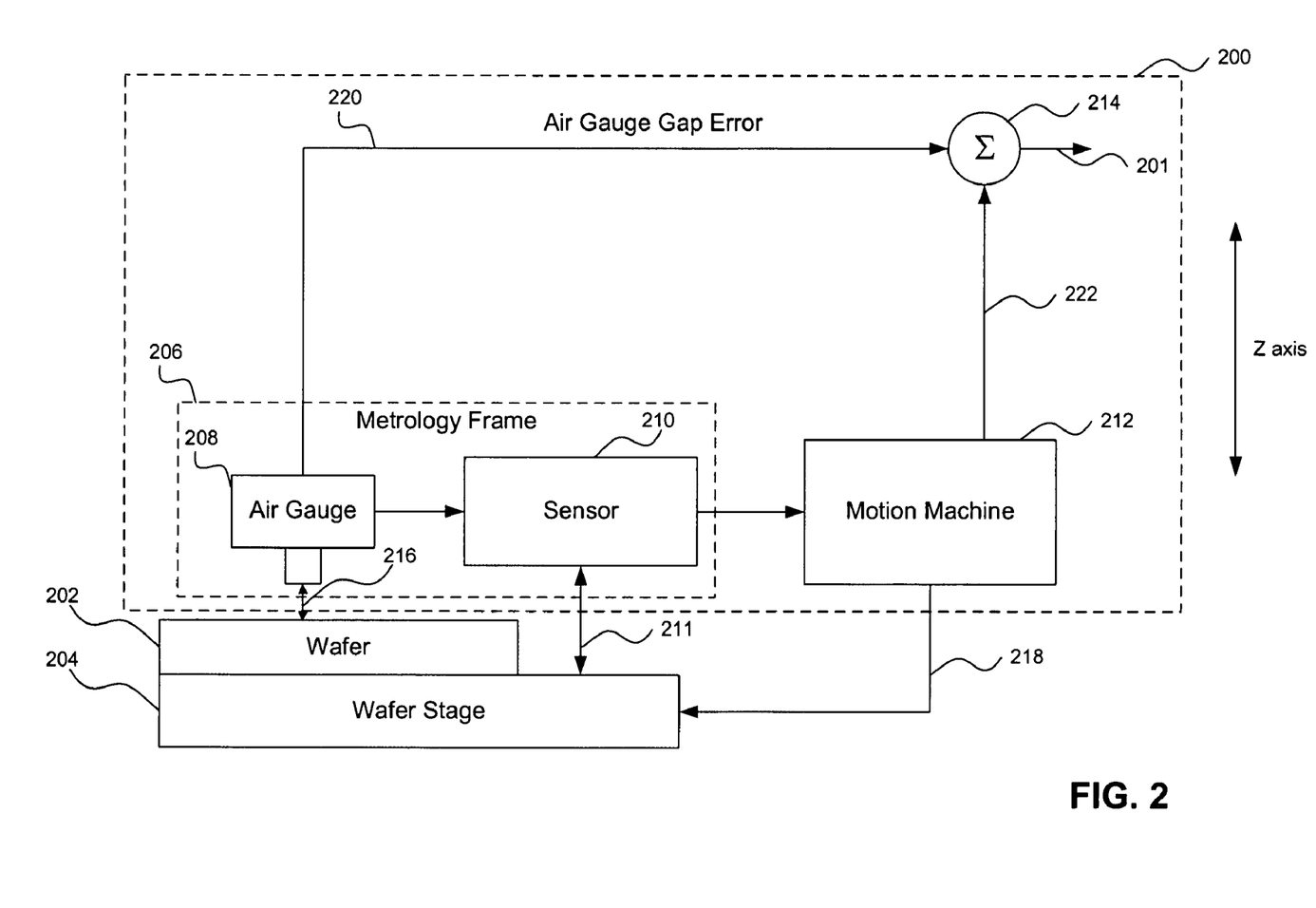
FIG. 2 is a block diagram illustration of a gauging device constructed in accordance with an embodiment of the present invention and used in the apparatus of FIG. 1.

FIG. 2 is an illustration of a gauging apparatus 200 constructed in accordance with an embodiment of the present invention. The exemplary gauging apparatus 200 of FIG. 2 can be used, for example, to supplement and/or replace the measurement probe 128, shown in FIG. 1. More specifically, output control signals 201 produced by the gauging apparatus 200 provide an extended air gauge reading. This extended air gauge reading is analogous to control signals output from the measurement probe 128, and forwarded along a feedback path 154.

According to the present invention, many of the limitations of conventional air gauge sensors can be overcome by replacing the conventional air gauge sensors with devices that use alternative sensing techniques. The exemplary gauging apparatus 200 is one such device.

The gauging device 200, of the present invention, essentially extends the measurement range of conventional gas proximity sensors by maintaining a constant gap between the sensor and a target, such as a wafer surface. This constant gap is maintained by either servoing the position of the sensor or servoing the target to reduce the sensitivity of the gauge to error, thus improving performance.

For example, although conventional air gauges are fairly accurate, their accuracy is restricted to relatively short distances. That is, air gauges typically have fairly short working distances, and much shorter measurement ranges than working distances. For example, a requirement may exist to measure a distance of 10 micrometers ($\mu m$). A conventional air gauge sensor, however, may have an accurate measurement range of only 1 $\mu m$.

By using the present invention, the air gauge is maintained at a constant gap and is restricted to measuring very miniscule changes (e.g., on the order of several nanometers) in the distance between the target and the air gauge. Then, for example, in one embodiment of the present invention, the air gauge can be moved or servoed as the distance between the air gauge and the target changes.

In being restricted to measuring small distances, the air gauge is only relied upon to measure the miniscule changes in distance between the air gauge and the target. Another sensing device is subsequently used to measure the movement of the air gauge. A combiner is then used to add the measured distance of the air gauge device with the measured distance of the second sensing device to produce a significantly more accurate combined measurement reading.

As noted above, the gauging apparatus 200 of the present invention produces a more accurate (i.e., extended) air gauge reading. This more accurate reading is represented, by output control signals 201. More specifically, the output control signals 201 more accurately represent the distance between an air gauge and a target, such as a wafer surface.

In the embodiment of FIG. 2, for example, the gauging apparatus 200 can be used to measure distances associated with a wafer 202 mounted on a movable wafer stage 204. In practice, the wafer stage 204 can be moveable in six degrees of freedom. However, for purposes of illustration only, the present invention will focus on measuring movement in only two degrees of freedom, along a vertical (Z) axis to a horizontal surface of the wafer stage 204.

The gauging apparatus 200 includes a metrology frame 206. In the present invention, the term "metrology frame" is used to denote an isolated frame of reference, which can be mechanically isolated from its associated measurement apparatus. Conventional metrology frames include sensitive components such as interferometers and other position sensors, which are isolated from vibration and other movements within the structure of the metrology frame. In the embodiment of FIG. 2, the metrology frame 206 includes an air gauge 208 and a sensor 210. The sensor 210 can include an interferometer, a cap gauge, an encoder, or the like. The sensor 210 measures a distance 211 to the wafer stage 204.

Also included in the gauging apparatus 200 is a motion generating machine 212, and a combiner 214. The present application is focused on movement in two degrees of freedom, i.e., along the vertical (Z) axis. The motion machine 212 can be an actuator, a motor, a controller, or any other device capable of producing motion. The gauging apparatus 200 is used to accurately measure a distance 216 between the air gauge 208 and the wafer 202.

In the example of FIG. 2, the distance 216 is maintained at a substantially constant gap. That is, the wafer 202 is desirably mounted to the wafer stage 204. During a measurement session, the distance 216 can change at least slightly, for example, due to changes in topography of the wafer 202. In the embodiment of FIG. 2, however, although the topography of the wafer 202 may change, the air gauge 208 is maintained in a substantially fixed position.

The wafer 202, mounted to-the wafer stage 204, is moved along the (Z) axis by the motion machine 212. The purpose of the movement along the (Z) axis is to make any adjustments necessary to maintain the distance 216 at a substantially constant value. That is, the motion machine 212 produces drive signals 218 that move the wafer stage 204 along the (Z) axis whenever slight changes occur in the distance 216. The distance 216 can be a preprogrammed based upon user requirements.

As the distance 216 changes, these changes are sensed by the air gauge 208. Correspondingly, measurement signals representative of any changes in the distance 216 are communicated to the motion machine 212.

In response, the motion machine 212 produces the drive signals 218 to move the wafer stage 204 along the (Z) axis by an amount necessary to readjust the distance 216 to the predetermined value. At the same time, air gauge gap error signals forwarded along a feedback path 220 are also communicated to the combiner 214. As the wafer stage 204 moves in accordance with the drive signals 218, its movement in the direction (Z) is measured by the sensor 210.

The measurement by the sensor 210 of the movement (in one direction) of the wafer stage 204 is forwarded along a path 221 to the motion machine 212. In response, the motion machine 212 produces the drive signals 218 to move the wafer stage 204 back, in the opposite direction. The movements produced by the motion machine 212 are quantified, and this quantified value is forwarded to the combiner 214 along a path 222. The combiner 214 then adds the values forwarded along the paths 220 and 222 to produce the combined measurement distance 201.

The combined measurement distance 201 produced by the embodiment shown in FIG. 2 can be used to increase the accuracy of the proximity of a proximity sensor, such as the measurement probe 128 of FIG. 1. In the system of FIG. 1, for example, the combined measurement distance 201 can be forwarded along the path 156 as a more accurate reading of the distance 140.

Figure 3:
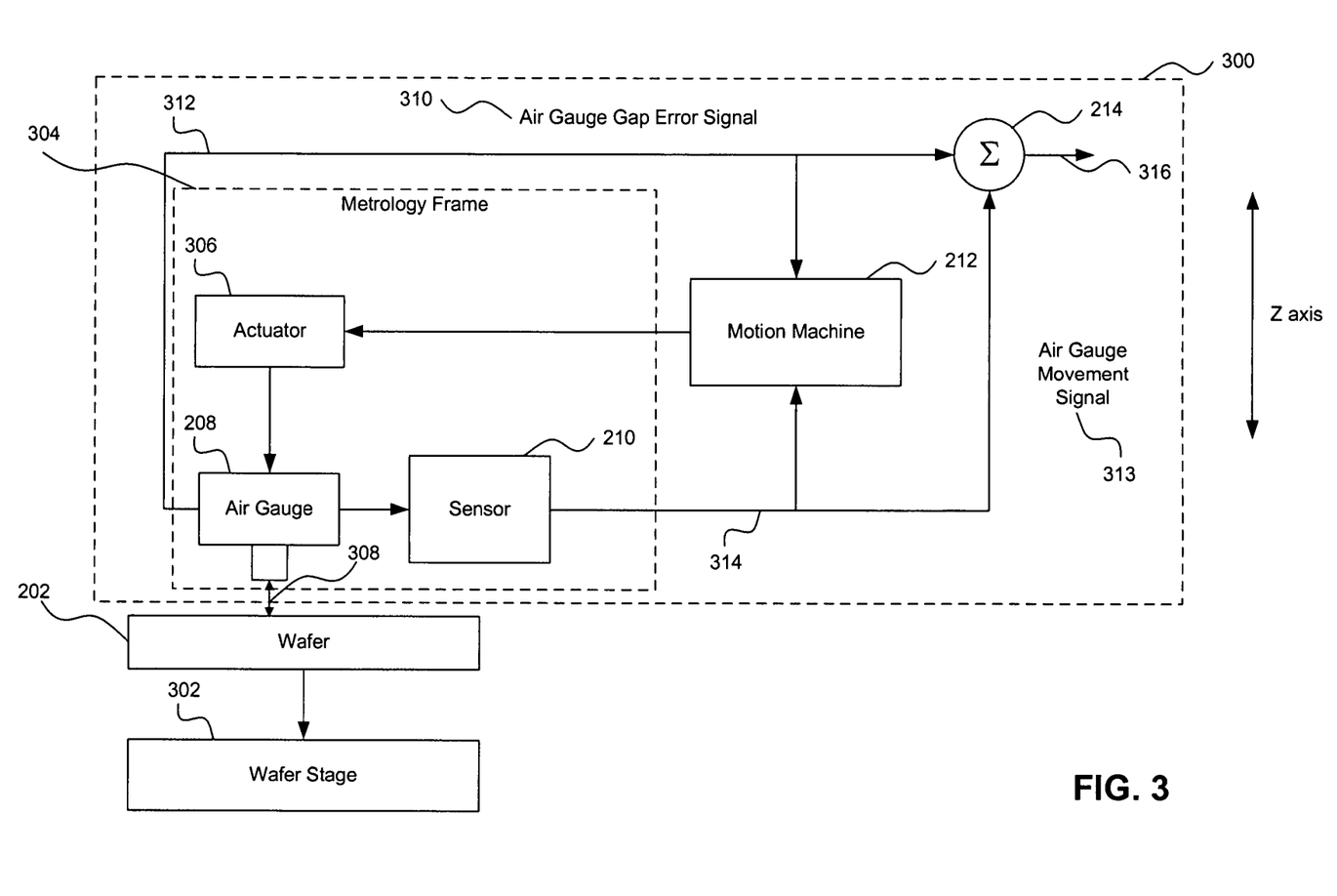
FIG. 3 is a block diagram illustration of a gauging apparatus constructed in accordance with a further embodiment of the present invention.

FIG. 3 is an illustration of a block diagram of a gauging apparatus 300 constructed in accordance with another embodiment of the present invention. In the embodiment of FIG. 3, an air gauge is moved or servoed while a target is maintained in a substantially stationary position. More specifically, in the example of FIG. 3, the gauging apparatus 300 is used to measure distances associated with the wafer 202 of FIG. 2. In the embodiment of FIG. 3, however, the wafer 202 is mounted on a substantially stationary wafer stage 304.

The gauging apparatus 300 of FIG. 3 can include many of the components used in the gauging apparatus 200 of FIG. 2. For example, the gauging apparatus 300 includes a metrology frame 306, which comprises the air gauge 208, the sensor 210, the motion machine 212, and the combiner 214 from the gauging device 200 of FIG. 2. In FIG. 3, however, the metrology frame 304 also includes an actuator 306.

During operation, the motion machine 212 adjusts the position of the air gauge 208 to minimize the amount of any air gap errors. For example, during a measurement session, as the wafer stage 302 moves along a horizontal direction (substantially stationary along the vertical (Z) axis), the air gauge 208 maintains a distance 308 from the wafer 202, at a substantially constant value. That is, as the wafer 202 moves along in the horizontal direction, and changes in a topography of the wafer 202 occur, the air gauge 208 is servoed along the vertical (Z) axis. The actuator 306 moves the air gauge 208 along the (Z) axis.

As the air gauge 208 moves, this movement is sensed and measured by the sensor 210. This movement is quantified and communicated to the motion machine 212 and the combiner 214, in the form of an air gauge gap movement signal along a feedback path 314. At the same time, an air gauge gap error signal is communicated to the combiner 214 along an error path 312.

The motion machine 212 then readjusts the position of the air gauge 208 via the actuator 306, in order to maintain the distance 308 at a substantially constant value. Finally, the combiner 214 combines the air gauge gap error signal and the air gauge movement signal 313 to produce an extended air gauge reading 316.

The extended air gauge reading 316 can be applied to the measurement probe 128 of FIG. 1. Particularly, the extended reading 316 can be forwarded along the path 156 to increase the overall accuracy of systems such as the proximity gauge sensor 100.

Figure 4:
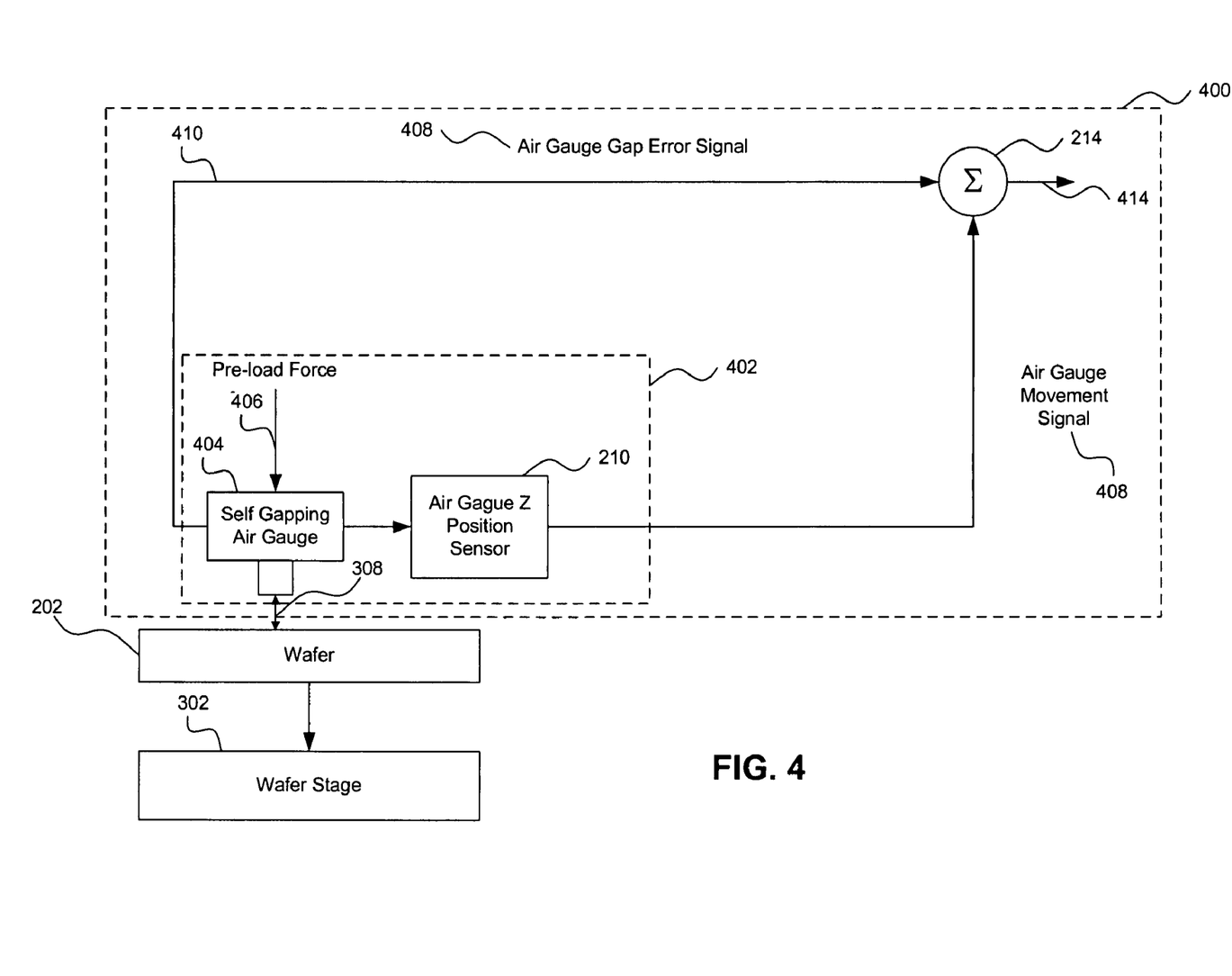
FIG. 4 is a block diagram illustration of a gauging apparatus constructed in accordance with yet another embodiment of the present invention.

FIG. 4 is an illustration of a gauging apparatus 400 constructed in accordance with yet another embodiment of the present invention. The gauging apparatus 400 of FIG. 4 operates in a manner similar to the gauging apparatus 300 of FIG. 3. However, in the exemplary embodiment of FIG. 4, a metrology frame 402 includes a self-gapping air gauge 404, which replaces the air gauge 208 of FIG. 3. As understood by persons having ordinary skill in the art, self-gapping air gauges include air bearings and operate based on the principles of aerostatic and aerodynamic design.

In the apparatus 400 of FIG. 4, the self-gapping air gauge 404 acts as an air bearing to sense a distance to an object. More specifically, in the gauging apparatus 400 of FIG. 4, the motion machine 212 and the actuator 308, shown in FIG. 3, can be eliminated. Their elimination is possible since the movement of the self-gapping air gauge 404 is self-maintained. For example, a preload force 406 applied by a spring (not shown) facilitates automatic readjustment of the self-gapping air gauge 404.

During operation, internally produced aerodynamic forces and the preload force 406 cooperate to maintain the distance 308 at a substantially constant value. As the air gauge 404 moves, its position is sensed by, for example, the position sensor 210, which subsequently forwards an air gauge movement signal 408 to the combiner 214. At the same time, and air gauge error signal 410 is forwarded along a feedback path 410 to the combiner 214.

As the self-gapping air gauge 404 moves, due for example to changes in the topography of the surface of the wafer 202, the preload force 406 readjusts the position of the air gauge in an attempt to maintain a constant air gap. In this manner, the gauging apparatus 400 of FIG. 4 is able to maintain a constant distance or gap 308 without any direct feedback from the sensor 210. The air gauge movement signal 408 and the air gauge error signal 410 are combined, within the combiner 214, to produce an extended air gauge topography measurement signal 414.

Figure 5:
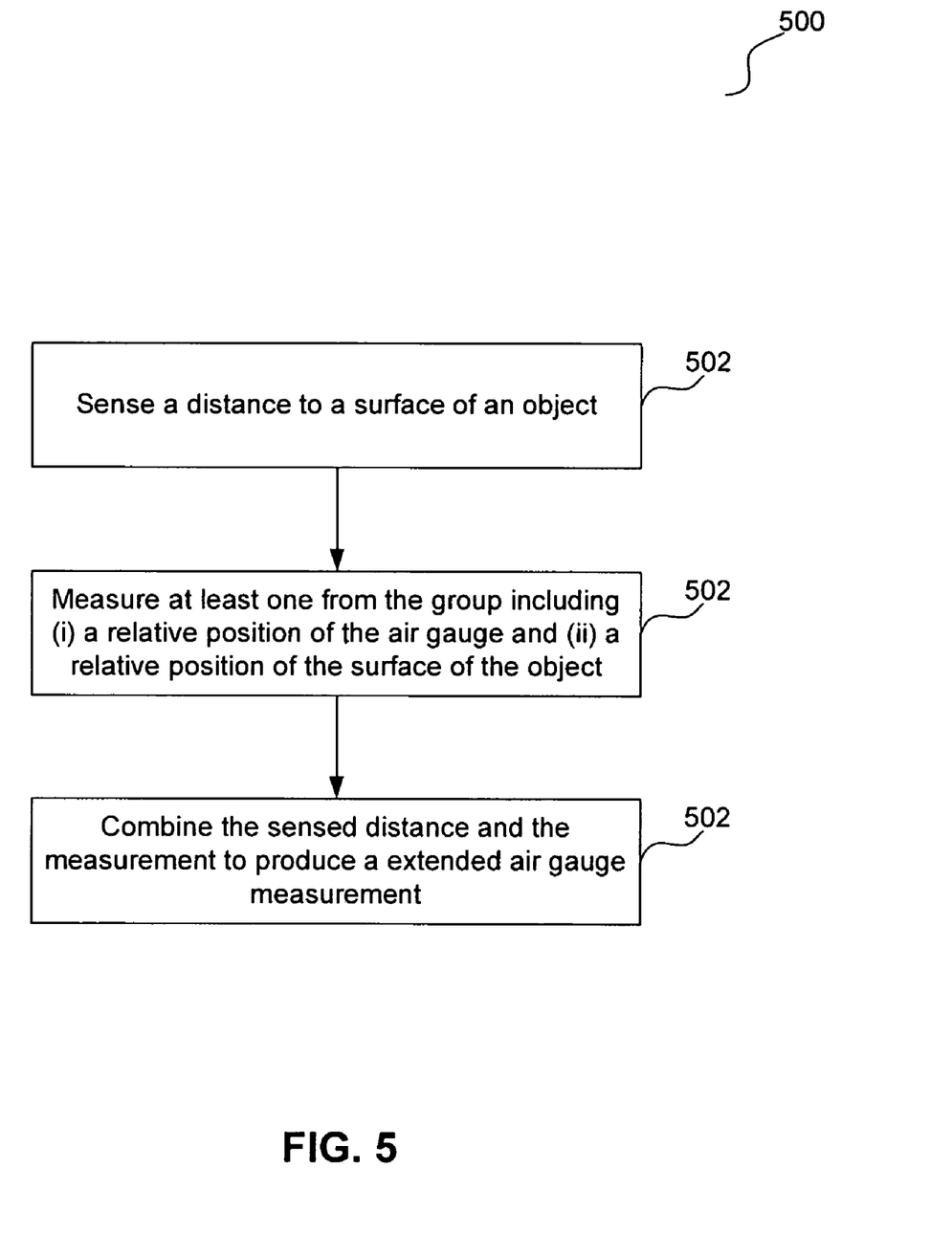
FIG. 5 is a flowchart of an exemplary method of practicing an embodiment of the present invention.

FIG. 5 is a flowchart of an exemplary method 500 of practicing an embodiment of the present invention. In FIG. 5, the gauging apparatus is used to sense a distance to a surface of an object, as indicated in step 502. Next, the gauging apparatus will measure at least one from a group including a relative position of an air gauge and the relative position of the surface of the object, as indicated in step 504. In step 506, the sensed distance and the measurement are combined to produce an extended air gauge measurement.

CONCLUSION

The present invention provides techniques, for example, whereby the position of a wafer substrate is controlled in a classical negative feedback loop. Using this feedback loop, a difference between the air gauge reading and a programmable set point value can be used to keep a measurement gap constant. Thus, while scanning a wafer, the air gauge maintains a known constant preprogrammed distance from the wafer surface.

By using the present invention, all of the desired characteristics of the air gauge can be preserved, while perfectly linear readings can be maintained. Additionally, programmability of the standoff can be improved. The air gauge can be operated at a more favorable standoff, maximizing its performance, and useful measurement range. At the same time, the risk of a collision between the air gauge nozzle and the wafer can essentially be eliminated.

The present invention has been described above with the aid of functional building blocks illustrating the performance of specified functions and relationships thereof. The boundaries of these functional building blocks have been arbitrarily defined herein for the convenience of the description. Alternate boundaries can be defined so long as the specified functions and relationships thereof are appropriately performed.

Any such alternate boundaries are thus within the scope and spirit of the claimed invention. Persons having ordinary skill in the art will recognize that these functional building blocks can be implemented by analog and/or digital circuits, discrete components, application-specific integrated circuits, firmware, processor executing appropriate software, and the like, or any combination thereof. Thus, the breadth and scope of the present invention should not be limited by any of the above-described exemplary embodiments, but should be defined only in accordance with the following claims and their equivalents.

The foregoing description of the specific embodiments will so fully reveal the general nature of the invention that others can, by applying knowledge within the skill of the art (including the contents of the references cited herein), readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted in light of the teachings and guidance presented herein, in combination with the knowledge of one of ordinary skill in the art.

What we claim is:

1. A system, comprising:
    a reference probe configured to measure a surface of a reference surface and to provide a reference signal;
    a measuring probe configured to measure a surface of an object supported on a stage and to provide a measurement signal;
    a sensor configured to sense a distance between the sensor and the stage and to provide a sensor signal; and
    a combiner configured to receive the sensor signal and the measurement signal and to provide a combination signal;
    wherein a desired distance between the measuring probe and the object is substantially maintained by adjusting a position of the stage, whereby the reference signal and the combination signal are compared to determine a topography of the surface of the object.

2. The system of claim 1, wherein the measuring probe is configured to provide a second measurement signal, further comprising:
    a controller configured to receive the second measurement signal and, based on the received second measurement signal, to adjust the position of the stage.

3. The system of claim 2, wherein the controller comprises a servo controller that is configured to control movement of the stage in a predetermined direction.

4. The system of claim 1, further comprising a metrology frame, wherein the sensor and the measuring probe are coupled to the metrology frame.

5. The system of claim 1, wherein the sensor has a range that exceeds a range of the measuring probe.

6. The system of claim 1, wherein the sensor comprises an interferometer, a cap gauge, or an encoder.

7. The system of claim 1, wherein the object comprises a substrate.

8. The system of claim 1, wherein the desired distance is at least one of a constant distance and a preprogrammed distance.

9. A method, comprising:
    (a) measuring a distance to a reference surface;
    (b) measuring a distance to an object supported by a stage;
    (c) sensing a distance between a sensor and the stage;
    (d) adjusting a position of the stage, wherein selectively a desired distance between a measuring probe and the object is substantially maintained; and
    (e) providing a combined signal based on steps (a) and (b); and
    (f) determining a topography of the object based at least on the combined signal.

10. The method of claim 9, wherein the distance is at least one of a constant distance and a preprogrammed distance.

* * * * *